United States Patent
Hsueh et al.

[11] Patent Number: 5,151,879
[45] Date of Patent: Sep. 29, 1992

[54] SENSE AMPLIFIER WITH LATCH

[75] Inventors: Paul W. Hsueh, Chandler; Douglas D. Smith, Mesa, both of Ariz.

[73] Assignee: Motorola, Inc., Schaumburg, Ill.

[21] Appl. No.: 634,630

[22] Filed: Dec. 27, 1990

[51] Int. Cl.[5] .............................................. G11C 13/00
[52] U.S. Cl. ............................... 365/190; 365/189.05; 365/230.06
[58] Field of Search ................... 365/190, 182, 189.01, 365/189.05, 230.06, 230.08; 307/530

[56] References Cited
U.S. PATENT DOCUMENTS
5,068,831 11/1991 Hoshi et al. .......................... 365/190

Primary Examiner—Terrell W. Fears
Attorney, Agent, or Firm—Bradley J. Botsch

[57] ABSTRACT

A memory sense amplifier with a latch circuit is provided. The combination of a sense amplifier and a latch circuit allows for increased speed operation and minimum space requirements on an integrated circuit. The memory sense amplifier receives complementary input logic signals that are typically from a memory cell and provides latched complementary output logic signals in response to the voltage levels of the complementary input logic signals.

13 Claims, 1 Drawing Sheet

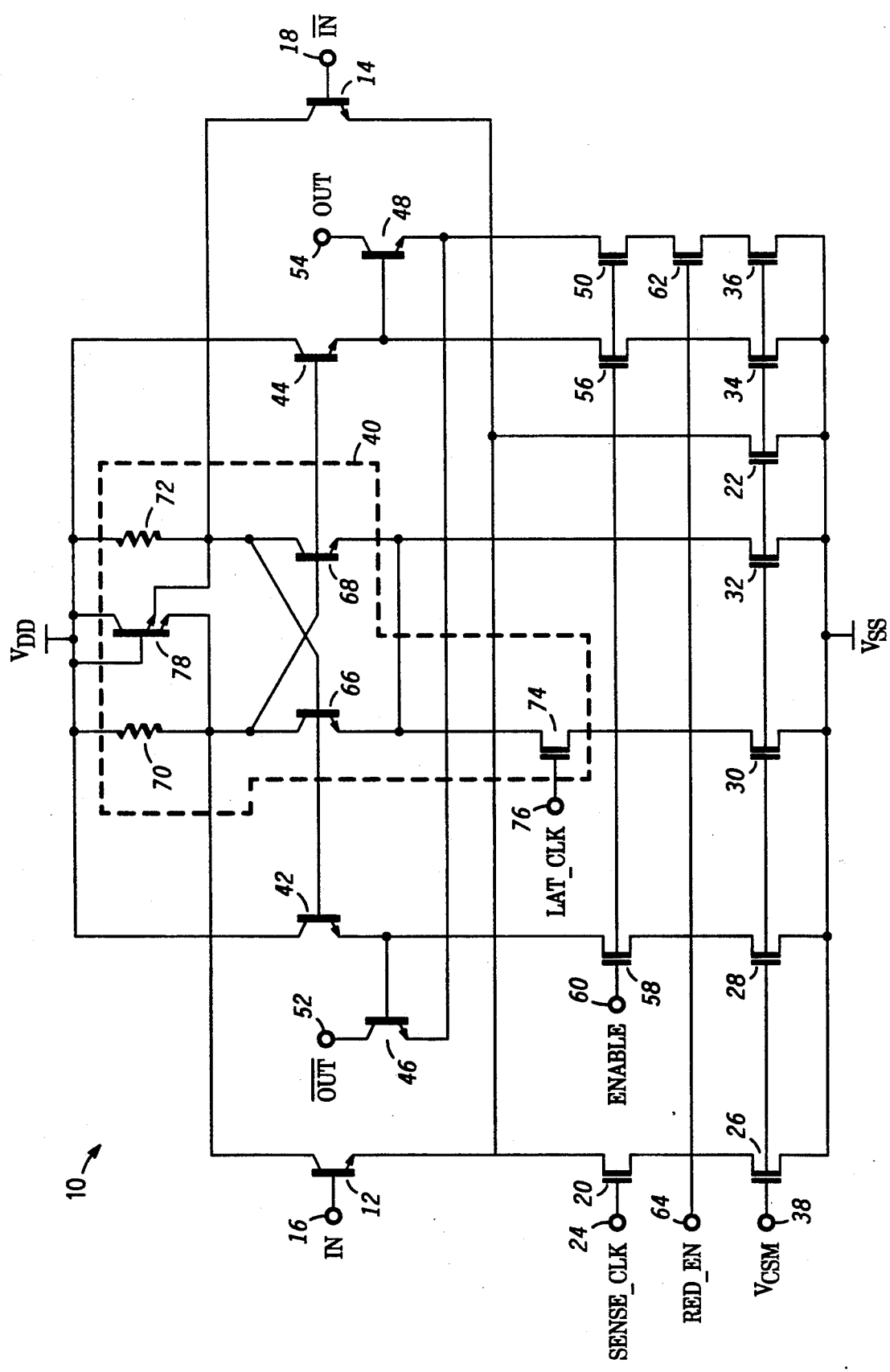

SENSE AMPLIFIER WITH LATCH

BACKGROUND OF THE INVENTION

This invention relates to sense amplifiers such as a sense amplifier including a latch for sensing differential complementary input logic signals from a memory cell and respectively providing complementary output logic signals.

Sense amplifiers typically sense complementary logic signals applied at its first and second inputs and respectfully provide complementary logic signals at its first and second outputs wherein the complementary logic signals appearing at first and second outputs of the sense amplifier are an amplified version of the complementary logic signals applied at the inputs of the sense amplifier. However, it would be advantageous to incorporate a latch circuit within a sense amplifier so that the overall structure is minimized and higher speed operation is achieved.

Hence, a need exists for a sense amplifier, including a latch circuit, for sensing complementary logic signals and providing complementary output logic signals at respective outputs of the latch circuit.

SUMMARY OF THE INVENTION

Briefly, the present invention includes a sense amplifier for detecting complementary logic signals comprising an input stage coupled for receiving the complementary logic signals applied at first and second inputs and for providing first and second output voltages at first and second outputs, the input stage being responsive to a first control signal for rendering the input stage operative; a latch circuit having first and second inputs respectively coupled to the first and second outputs of the input stage and for providing voltages at first and second outputs of the latch circuit, the latch circuit being responsive to a second control signal for rendering the latch circuit operative; a first circuit having first and second inputs and first and second outputs, the first and second inputs of the first circuit being respectively coupled to the first and second outputs of the latch circuit for level shifting the voltages appearing at the first and second outputs of the latch circuit by a predetermined voltage; and an output stage coupled to the first and second outputs of the first circuit for providing complementary output logic signals at first and second outputs of the sense amplifier, the complementary output logic signals being determined by corresponding voltage levels of the complementary logic signals.

It is an advantage of the present invention that a latch circuit is incorporated within a sense amplifier such that complementary logic signals from a memory cell are sensed at the inputs of the sense amplifier while respective complementary output logic signals are provided at the output of the latch circuit wherein space requirements for the sense amplifier are minimized and speed operation is increased.

The above and other features and advantages of the present invention will be better understood by the following detailed description taken in conjunction with the accompanying drawing.

BRIEF DESCRIPTION OF THE DRAWING

The sole FIGURE is a detailed schematic diagram illustrating the sense amplifier circuit in accordance with the present invention.

DETAILED DESCRIPTION OF THE INVENTION

Referring to the sole FIGURE, sense amplifier circuit 10 of the present invention is shown comprising differential emitter coupled transistor pair 12 and 14 wherein the base of transistor 12 is coupled to terminal 16 at which signal IN is applied, and wherein the base of transistor 14 is coupled to terminal 18 at which signal $\overline{\text{IN}}$ is applied. The emitters of transistors 12 and 14 are coupled to the drain electrodes of NMOS transistors 20 and 22. The gate electrode of NMOS transistor 20 is coupled to terminal 24 at which signal SENSE_CLK is applied. The source electrode of NMOS transistor 20 is coupled to the drain electrode of NMOS transistor 26, the latter having a source electrode coupled to a first supply voltage terminal at which the operating potential $V_{SS}$ is applied. The gate electrode of NMOS transistor 26 is coupled to the gate electrodes of NMOS transistors 22, 28, 30, 32, 34 and 36. The gate electrode of NMOS transistor 26 is also coupled to terminal 38 at which bias potential $V_{CSM}$ is applied. The source electrodes of NMOS transistors 22, 28, 30, 32, 34 and 36 are all coupled to operating potential $V_{SS}$. It is worth noting that NMOS transistors 22, 28, 30, 32, 34 and 36 are MOS current sources and, thus, they can be turned off via bias potential $V_{CSM}$ thereby resulting in a substantial power savings over typical bipolar current sources. The collectors of transistors 12 and 14 are respectively coupled to first and second inputs of latch circuit 40. The first and second outputs of latch circuit 40 are respectively coupled to the bases of level shift transistors 42 and 44. The collectors of transistors 42 and 44 are coupled to a second supply voltage terminal at which the operating potential $V_{DD}$ is applied. The emitters of transistors 42 and 44 are respectively coupled to the bases of output transistors 46 and 48. The emitters of output transistors 46 and 48 are coupled to the drain electrode of NMOS transistor 50. The collector of output transistor 46 is coupled to terminal 52 at which signal $\overline{\text{OUT}}$ is provided, while the collector of output transistor 48 is coupled to terminal 54 at which signal OUT is provided. The gate electrodes of NMOS transistors 50, 56 and 58 are coupled to terminal 60 at which signal ENABLE is applied. The drain electrode of NMOS transistor 58 is coupled to the base of transistor 46 while the source electrode of NMOS transistor 58 is coupled to the drain electrode of NMOS transistor 28. Likewise, the drain electrode of NMOS transistor 56 is coupled to the base of transistor 48, while the source electrode of NMOS transistor 56 is coupled to the drain electrode of NMOS transistor 34. NMOS transistor 62 has a drain electrode coupled to the source electrode of NMOS transistor 50 and a source electrode coupled to the drain electrode of NMOS transistor 36. Further, the gate electrode of NMOS transistor 62 is coupled to terminal 64 at which signal RED_EN is applied.

Latch circuit 40 includes transistor 66 which has a base coupled to the collector of transistor 68 and a collector coupled to the base of transistor 68. The collector of transistor 66 is also coupled by resistor 70 to operating potential $V_{DD}$. Similarly, the collector of transistor 68 is coupled by resistor 72 to operating potential $V_{DD}$. The emitters of transistors 66 and 68 are coupled to the drain electrodes of NMOS transistors 32 and 74. The source electrode of NMOS transistor 74 is coupled to the drain electrode of NMOS transistor 30. Further, the gate electrode of NMOS transistor 74 is coupled to terminal 76 at which signal LAT_CLK is applied.

Latch circuit 40 also includes clamping transistor 78 which has a base and a collector coupled to operating potential $V_{DD}$. Further, transistor 78 has a first emitter coupled to the collector of transistor 66 and a second emitter coupled to the collector of transistor 68.

First, a brief description of the plurality of signals utilized in sense amplifier circuit 10. Signals IN and $\overline{\text{IN}}$ are complementary logic signals which are typically provided from complementary bit lines from a memory cell whereby the differential voltage between signals IN and $\overline{\text{IN}}$ is typically only 50-80 millivolts. It is worth noting that transistors 12 and 14 typically have a high transconductance to allow for sensing small voltages at terminals 16 and 18. Further, signals OUT and $\overline{\text{OUT}}$ are complementary output logic signals that are respectively provided at terminals 54 and 52. Signal SENSE_CLK is a control signal such that when a logic high voltage is applied at terminal 24, NMOS transistor 20 is rendered operative thereby enabling the input stage which includes differential emitter coupled pair of transistors 12 and 14. Therefore, it should be realized that when NMOS transistor 20 is operative, input transistors 12 and 14 become enabled since they are now coupled to the drain electrode of NMOS transistor 26 which provides a predetermined current. Signal LAT_CLK is a control signal for rendering NMOS transistor 74 operative when a logic high voltage level is applied at terminal 76 thereby enabling latch circuit 40. Signal ENABLE is an enable signal for rendering NMOS transistors 50, 56 and 58 operative when a logic high voltage level is applied to terminal 60 thereby enabling level shift transistors 42 and 44 and output transistors 46 and 48. Signal RED_EN is a redundancy enable signal such that when a logic low is applied at terminal 64, NMOS transistor 62 is rendered non-operative thereby disabling sense amplifier 10 which could be the result of a faulty memory cell. Finally, voltage $V_{CSM}$ is a bias voltage applied to the gate electrodes of NMOS transistors 22, 26, 28, 30, 32, 34 and 36 thereby providing predetermined currents which flow through the respective NMOS transistors. Thus, transistors 22, 26, 28, 30, 32, 34 and 36 comprise a current source means for sense amplifier circuit 10.

In normal operation, signals ENABLE and RED_EN respectively provide logic high voltage levels at terminals 60 and 64 thereby rendering NMOS transistors 50, 56, 58 and 62 operative which essentially enable level shift transistors 42 and 44 as well as the output stage (transistors 46 and 48). When the sensing of input signals IN and $\overline{\text{IN}}$ is desired, signal SENSE_CLK applies a logic high voltage level to the gate electrode of NMOS transistor 20 thereby enabling the input stage which includes differential emitter coupled transistors 12 and 14. Initially, assume that the voltage level applied at terminal 16 is greater than the voltage level applied at terminal 18. This implies that most of the current provided by current source NMOS transistor 26 flows through resistor 70 and transistor 12 thereby providing a first predetermined voltage at the first input of latch circuit 40. In addition, this also implies that a small amount of current flows through resistor 72 and transistor 14 thereby providing a second predetermined voltage at the second input of latch circuit 40 which is more positive than the voltage appearing at the first input of latch circuit 40 due to the voltage drop across resistor 70. Once the signals at terminals 16 and 18 have been sensed, signal LAT_CLK applies a logic high voltage level at the gate electrode of NMOS transistor 74 thereby enabling latch circuit 40. Shortly thereafter, signal SENSE_CLK applies a logic low voltage level to the gate electrode of NMOS transistor 20 thereby disabling the input stage. Latch circuit 40 is responsive to the predetermined voltages provided at first and second inputs of latch circuit 40 and provides complementary logic voltage levels respectively at second and first outputs of latch circuit 40. Therefore, when latch circuit 40 is enabled by signal LAT_CLK, the more positive voltage potential appearing at the second input of latch circuit 40 is applied to the base of transistor 66 while the less positive voltage potential appearing at the first input of latch circuit 40 is applied to the base of transistor 68 and, thus, substantially all the current provided from NMOS transistor 30 flows through resistor 70 and transistor 66 while substantially zero current flows through resistor 72 and transistor 68. As a result, under the initial assumption that the voltage applied at terminal 16 is greater than the voltage applied at terminal 18, it should then be realized that the voltage applied at the base of level shift transistor 42 will be more positive than the voltage applied at the base of level shift transistor 44. Further, it should also be realized that level shift transistors 42 and 44 are enabled since signal ENABLE is a logic high voltage level as aforementioned.

Level shift transistors 42 and 44 function to shift down the voltage appearing at the bases of transistors 42 and 44 respectively to voltages at the bases of output transistors 46 and 48 thereby preventing output transistors 46 and 48 from saturating. Therefore, it should be realized that the voltage applied at the base of output transistor 46 is more positive than the voltage applied at the base of output transistor 48 thereby forcing output transistor 46 to conduct more collector-emitter current than output transistor 48. This will subsequently result in the voltage appearing at terminal 52 to be less positive than the voltage appearing at terminal 54. In other words, the differential voltage at terminals 52 and 54 is a function of the difference of the base-emitter voltages of transistors 46 and 48 which is due to different currents flowing through transistors 46 and 48. Thus, the magnitude of the delta voltage ($\Delta V$) appearing at terminals 52 and 54 can be expressed as:

$$\Delta V = V_T \times ABS[LN(I_{C46}/I_{C48})] \quad (1)$$

where $V_T$ is the thermal voltage, which is approximately 26 millivolts;

ABS and LN are the mathematical absolute value and natural log functions, respectively;

$I_{C46}$ is the collector current of output transistor 46; and $I_{C48}$ is the collector current of output transistor 48.

It should be realized that since the current through transistor 46 is greater than the current through transistor 48, then the voltage appearing at terminal 52 will be less positive than the voltage appearing at terminal 54 by the amount $\Delta V$. Thus, the voltage level of signal OUT is more positive than the voltage level of signal $\overline{\text{OUT}}$ which is expected since the voltage level of signal IN was greater than the voltage level of signal $\overline{\text{IN}}$. It can be said that signals OUT and $\overline{\text{OUT}}$ are complementary output logic signals. Further, it is worth noting that the differential voltage between logic signals OUT and $\overline{\text{OUT}}$ is typically 20-30 millivolts. Although the voltage at output terminals 52 and 54 is small, it should be realized that output transistors 46 and 48 are current sense transistors, and that the current differential through transistors 46 and 48 is substantially larger due to the difference in voltages appearing at the bases of transistors 46 and 48.

It is worth noting that output terminals 52 and 54 can be coupled to a second stage amplifier (not shown) wherein the different currents flowing through the collectors of transistors 46 and 48 will also flow through first and second input transistors (not shown) of the second stage amplifier thereby creating a delta $V_{BE}$ across the base-emitters of the first and second transistors of the second stage amplifier which is similar to the delta $V_{BE}$ across the base-emitters of transistors 46 and 48.

On the other hand, if the initial assumption was that the voltage level applied at terminal 16 was less than the voltage level applied at terminal 18, it should be realized that the voltage appearing at the first input of latch circuit 40 will be more positive than the voltage appearing at the second input of latch circuit 40. As a result, it should further be realized from the situation described above that the voltage applied to the base of output transistor 46 will be less positive than the voltage applied at the base of output transistor 48 thereby forcing output transistor 46 to conduct less collector-emitter current than output transistor 48. This will subsequently result in the voltage appearing at terminal 52 to be more positive than the voltage appearing at terminal 54 (by the amount $\Delta V$ as calculated in EQN. 1) which is expected since the voltage level of signal IN was less than the voltage level of signal $\overline{IN}$. In summary, complementary logic signals applied at terminals 16 and 18 result in complementary output logic signals appearing at output terminals 52 and 54 such that if the voltage applied to terminal 16 is more positive than the voltage applied to terminal 18, then the voltage appearing at terminal 52 is less positive than the voltage appearing at terminal 54. Contrary, if the voltage applied to terminal 16 is less positive than the voltage applied to terminal 18, then the voltage appearing at terminal 52 is more positive than the voltage appearing at terminal 54.

NMOS transistors 28 and 34 respectively provide predetermined bias currents through level shift transistors 42 and 44 when NMOS transistors 58 and 56, respectively, are rendered operative by signal ENABLE. NMOS transistor 30 provides a predetermined bias current for latch 40 when NMOS transistor 74 is rendered operative by signal LAT_CLK. NMOS transistor 36 provides a predetermined bias current for output transistors 46 and 48 when NMOS transistor 62 is rendered operative by signal RED_EN and NMOS transistor 50 is rendered operative by signal ENABLE. In addition, NMOS transistors 22 and 32 provide small bias currents respectively for the input stage and latch 40 so that some base charge remains within transistors 12, 14, 66 and 68 thereby allowing for faster turn-on time of sense amplifier circuit 10.

By now it should be apparent that a novel sense amplifier has been provided that includes a latch circuit for sensing differential complementary logic signals from a memory cell and respectively providing logic output signals.

We claim:

1. A sense amplifier for detecting complementary logic signals, comprising:
    an input stage coupled for receiving the complementary logic signals applied at first and second inputs and for providing first and second output voltages at first and second outputs, said input stage being responsive to a first control signal for rendering said input stage operative;
    a latch circuit having first and second inputs respectively coupled to said first and second outputs of said input stage and for providing voltages at first and second outputs of said latch circuit, said latch circuit being responsive to a second control signal for rendering said latch circuit operative;
    first means having first and second inputs and first and second outputs, said first and second inputs of said first means being respectively coupled to said first and second outputs of said latch circuit for level shifting said voltages appearing at said first and second outputs of said latch circuit by a predetermined voltage; and
    an output stage coupled to said first and second outputs of said first means for providing complementary output logic signals at first and second outputs of the sense amplifier, said complementary output logic signals being determined by corresponding voltage levels of the complementary logic signals.

2. The sense amplifier according to claim 1 wherein said latch circuit includes:
    a first transistor having a collector, a base and an emitter, said collector being coupled to said first input of said latch circuit, and said base being coupled to said second input of said latch circuit and to said first output of said latch circuit;
    a second transistor having a collector, a base and an emitter, said collector of said second transistor being coupled to said base of said first transistor, said base of said second transistor being coupled to said collector of said first transistor and to said second output of said latch circuit, and said emitter of said second transistor being coupled to said emitter of said first transistor;
    a third transistor having first, second and control electrodes, said first electrode being coupled to said emitters of said first and second transistors, said second electrode being coupled to a first supply voltage terminal, and said control electrode being coupled to said second control signal;
    a first resistor coupled between said first input of said latch circuit and a second supply voltage terminal; and
    a second resistor coupled between said second input of said latch circuit and said second supply voltage terminal.

3. The sense amplifier according to claim 2 wherein said first means includes:
    a fourth transistor having a collector, a base and an emitter, said collector of said fourth transistor being coupled to said second supply voltage terminal, said base of said fourth transistor being coupled to said first input of said first means, and said emitter of said fourth transistor being coupled to said first output of said first means; and
    a fifth transistor having a collector, a base and an emitter, said collector of said fifth transistor being coupled to said second supply voltage terminal, said base of said fifth transistor being coupled to said second input of said first means, and said emitter of said fifth transistor being coupled to said second output of said first means.

4. The sense amplifier according to claim 3 wherein said output stage includes:

a sixth transistor having a collector, a base and an emitter, said collector of said sixth transistor being coupled to said first output of the sense amplifier, said base of said sixth transistor being coupled to said emitter of said fourth transistor, and said emitter of said sixth transistor being coupled to said first supply voltage terminal; and a seventh transistor having a collector, a base and an emitter, said collector of said seventh transistor being coupled to said second output of the sense amplifier, said base of said seventh transistor being coupled to said base of said fifth transistor, and said emitter of said seventh transistor being coupled to said first supply voltage terminal.

5. In a memory system, a memory sense amplifier for detecting complementary logic signals from a memory cell, comprising:

current source means responsive to a bias potential for providing a plurality of currents respectively at a plurality of outputs;

an input stage, responsive to a first control signal, for sensing voltages applied at first and second inputs of said input stage and for providing first and second voltages at first and second outputs of said input stage, said input stage being rendered operative when said first control signal is in a first logic state such that said input stage is coupled to a first output of said current source means;

a latch circuit responsive to a second control signal and having first and second inputs respectively coupled to said first and second outputs of said input stage, said latch circuit providing voltages at first and second outputs of said latch circuit when said second control signal is in a first logic state such that said latch circuit is coupled to a second output of said current source means;

first means having first and second inputs and first and second outputs, said first and second inputs of said first means being respectively coupled to said first and second outputs of said latch circuit for level shifting said voltages appearing at said first and second outputs of said latch circuit by a predetermined voltage; and an output stage coupled to said first and second outputs of said first means for providing complementary output logic signals at first and second outputs of the memory sense amplifier.

6. The memory sense amplifier according to claim 5 wherein said latch circuit includes:

a first transistor having a collector, a base and an emitter, said collector being coupled to said first input of said latch circuit, and said base being coupled to said second input of said latch circuit and to said first output of said latch circuit;

a second transistor having a collector, a base and an emitter, said collector of said second transistor being coupled to said base of said first transistor, said base of said second transistor being coupled to said collector of said first transistor and to said second output of said latch circuit, and said emitter of said second transistor being coupled to said emitter of said first transistor;

a third transistor having first, second and control electrodes, said first electrode being coupled to said emitters of said first and second transistors, said second electrode being coupled to said second output of said current source means, and said control electrode being coupled to said second control signal;

a first resistor coupled between said first input of said latch circuit and a first supply voltage terminal; and a second resistor coupled between said second input of said latch circuit and said first supply voltage terminal.

7. The memory sense amplifier according to claim 6 wherein said first means includes:

a fourth transistor having a collector, a base and an emitter, said collector of said fourth transistor being coupled to said first supply voltage terminal, said base of said fourth transistor being coupled to said first input of said first means, and said emitter of said fourth transistor being coupled to said first output of said first means and to said current source means; and a fifth transistor having a collector, a base and an emitter, said collector of said fifth transistor being coupled to said first supply voltage terminal, said base of said fifth transistor being coupled to said second input of said first means, and said emitter of said fifth transistor being coupled to said second output of said first means and to said current source means.

8. The memory sense amplifier according to claim 7 wherein said output stage includes:

a sixth transistor having a collector, a base and an emitter, said collector of said sixth transistor being coupled to said first output of the memory sense amplifier, said base of said sixth transistor being coupled to said emitter of said fourth transistor, and said emitter of said sixth transistor being coupled to said current source means; and a seventh transistor having a collector, a base and an emitter, said collector of said seventh transistor being coupled to said second output of the memory sense amplifier, said base of said seventh transistor being coupled to said base of said fifth transistor, and said emitter of said seventh transistor being coupled to said current source means.

9. The memory sense amplifier according to claim 8 wherein said input stage includes:

an eighth transistor having a collector, a base and an emitter, said collector of said eighth transistor being coupled to said first output of said input stage, said base of said eighth transistor being coupled to said first input of said input stage, and said emitter of said eighth transistor being coupled to said first output of said current source means; and a ninth transistor having a collector, a base and an emitter, said collector of said ninth transistor being coupled to said second output of said input stage, said base of said ninth transistor being coupled to said second input of said input stage, and said emitter of said ninth transistor being coupled to said emitter of said tenth transistor.

10. The memory sense amplifier according to claim 9 wherein said latch circuit further includes clamping means coupled to said collectors of said first and second transistors to prevent said first and second transistors from saturating.

11. A memory sense amplifier for detecting complementary logic signals applied at first and second inputs and for providing complementary output logic signals at first and second outputs, comprising:

current source means responsive to a bias potential and having a plurality of currents respectively provided at a plurality of outputs;

a first transistor having a collector, a base and an emitter, said base being coupled to the first input of the memory sense amplifier;

a second transistor having a collector, a base and an emitter, said base of said second transistor being coupled to the second input of the memory sense amplifier, and said emitter of said second transistor being coupled to said emitter of said first transistor;

a third transistor having first, second and control electrodes, said first electrode being coupled to said emitter of said first transistor, said second electrode being coupled to a first output of said current source means, and said control electrode being coupled to a first control signal;

a fourth transistor having a collector, a base and an emitter, said collector of said fourth transistor being coupled to said collector of said first transistor;

a fifth transistor having a collector, a base and an emitter, said collector of said fifth transistor being coupled to said collector of said second transistor and to said base of said fourth transistor, said base of said fifth transistor being coupled to said collector of said fourth transistor, and said emitter of said fifth transistor being coupled to said emitter of said fourth transistor;

a sixth transistor having first, second and control electrodes, said first electrode of said sixth transistor being coupled to said emitter of said fourth transistor, said second electrode of said sixth transistor being coupled to a second output of said current source means, and said control electrode of said sixth transistor being coupled to a second control signal;

a seventh transistor having a collector, a base and an emitter, said collector of said seventh transistor being coupled to first supply voltage terminal, and said base of said seventh transistor being coupled to said base of said fourth transistor;

an eighth transistor having a collector, a base and an emitter, said collector of said eighth transistor being coupled to said first supply voltage terminal, and said base of said eighth transistor being coupled to said base of said fifth transistor;

a ninth transistor having first, second and control electrodes, said first electrode of said ninth transistor being coupled to said emitter of said seventh transistor, said second electrode of said ninth transistor being coupled to a third output of said current source means, and said control electrode of said ninth transistor being coupled to a third control signal;

a tenth transistor having first, second and control electrodes, said first electrode of said tenth transistor being coupled to said emitter of said eighth transistor, said second electrode of said tenth transistor being coupled to a fourth output of said current source means, and said control electrode of said tenth transistor being coupled to said third control signal;

an eleventh transistor having a collector, a base and an emitter, said collector of said eleventh transistor being coupled to the first output of the memory sense amplifier, and said base of said eleventh transistor being coupled to said emitter of said seventh transistor;

a twelfth transistor having a collector, a base and an emitter, said collector of said twelfth transistor being coupled to the second output of the memory sense amplifier, said base of said twelfth transistor being coupled to said emitter of said eighth transistor, and said emitter of said twelfth transistor being coupled to said emitter of said eleventh transistor;

a thirteenth transistor having first, second and control electrodes, said first electrode of said thirteenth transistor being coupled to said emitter of said twelfth transistor, said second electrode of said thirteenth transistor being coupled to a fifth output of said current source means, and said control electrode of said thirteenth transistor being coupled to said third control signal;

a first resistor coupled between said collector of said fourth transistor and said first supply voltage terminal; and a second resistor coupled between said collector of said fifth transistor and said first supply voltage terminal.

12. The memory sense amplifier according to claim 11 further includes a clamping transistor having a collector, a base and first and second emitters, said collector and said base of said clamping transistor being coupled to said first supply voltage terminal, said first emitter of said clamping transistor being coupled to said collector of said fourth transistor, and said second emitter of said clamping transistor being coupled to said collector of said fifth transistor.

13. A method for providing complementary output logic signals in response to logic signals from a memory cell, the method comprising the steps of:

sensing voltage levels of the logic signals applied at first and second inputs;

latching said voltage levels appearing at said first and second inputs respectively to voltages at first and second outputs;

level shifting said voltages appearing at said first and second outputs to provide voltages at third and fourth outputs; and providing complementary output logic signals in response to said voltages at said third and fourth outputs.

* * * * *